(12) United States Patent
Tsuchiya

(10) Patent No.: US 6,233,187 B1
(45) Date of Patent: May 15, 2001

(54) SEMICONDUCTOR MEMORY DEVICE

(75) Inventor: Tomohiro Tsuchiya, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/490,597

(22) Filed: Jan. 25, 2000

(30) Foreign Application Priority Data

Jan. 25, 1999 (JP) .................................................. 11-016032

(51) Int. Cl.[7] .................................................. G11C 11/24
(52) U.S. Cl. .......................................... 365/203; 365/201
(58) Field of Search .................................... 365/203, 149, 365/226, 201, 189.06

(56) References Cited

U.S. PATENT DOCUMENTS 5,255,232 * 10/1993 Foss ....................................... 365/203
5,303,183 * 4/1994 Asakura ................................. 365/149

* cited by examiner

Primary Examiner—A. Zarabian
(74) Attorney, Agent, or Firm—Darryl G. Walker

(57) ABSTRACT

A semiconductor memory device can inhibit undesirable fluctuations of memory cell signals that can occur at remote ends of the device, thereby improving sense margins over conventional approaches. The semiconductor memory device (100) can include a half power source (HVCC) level generating circuit that supplies a half-supply potential for an opposite-to-cell level and for precharging digit lines. Shunting circuits (103) can shunt the connection between the opposite-to-supply level HVCP1 and the precharge (reference) level, and are situated at various places close to sense amplifier areas. This arrangement can make it possible to inhibit fluctuations in signal levels that can occur due to capacitive coupling of indeterminate data nodes when a refresh operation is introduced after power-up. Such inhibiting of fluctuations can occur even for memory cells that are situated remotely from the HVCC level generating circuit. Consequently, sense margins can be improved over conventional approaches.

17 Claims, 4 Drawing Sheets

SEMICONDUCTOR MEMORY DEVICE

TECHNICAL FIELD

The present invention relates generally to semiconductor memory devices, and more particularly to semiconductor memory devices that include an array of memory cells that each include a transistor and a capacitor.

BACKGROUND OF THE INVENTION

FIG. 7 shows a circuit diagram of a conventional semiconductor memory device, designated by the general reference character 700. The semiconductor memory device 700 is shown to include a "half source voltage" (HVCC) signal generator 701, memory cells (MCi1 to MCin), precharge circuits (PC1 to PCn), digit lines (D1/#D1 to Dn/#Dn), and sense amplifiers (SA1 to SAn). The HVCC signal generator 701 can supply a voltage that is ½ VCC, where VCC is a power source voltage. In the reference characters for memory cells (MCi1 to MCin), the value "i" can be a positive integer that can correspond to a row of an array. Each memory cell (MCi1 to MCin) can include a transistor Q and a capacitor C. Precharge circuits (PC1 to PCn) can precharge corresponding digit lines (D1/#D1 to Dn/#Dn) according to a precharge signal BLP. The symbol "#" can indicate that a line can carry a negative logic signal.

In the arrangement of FIG. 7, the HVCC signal generator 701 provides a potential at the ½VCC level to a node N2 and a node N3. Node N2 can provide a precharge level HVCD to the digit lines (D1/#D1 to Dn/#Dn). Node N3 can provide an "opposite-to-cell" level HVCP1 to memory cells (MCi1 to MCin). Within the memory cells (MCi1 to MCin), each capacitor C can include a data storage terminal connected to its corresponding transistor Q, and an opposing terminal. The opposing terminals can be commonly connected to node N3.

The HVCD and HVCP1 levels are driven to a ½VCC value for a number of reasons. First, precharging the digit lines (D1/#D1 to Dn/#Dn) to such a level can provide for better sense margins when sensing data values stored in the memory cells (MCi1 to MCin). Second, precharging digit lines (D1/#D1 to Dn/#Dn) and maintaining node 3 at a ½VCC level can serve as a countermeasure against variations in power supply levels ("bumps"). Third, maintaining node 3 at the ½VCC level can protect memory cells against undesirable high voltages across memory cell capacitors. Fourth, precharging the digit lines (D1/#D1 to Dn/#Dn) to a ½VCC level can, for typical data value combinations, reduce digit line precharge current. The first and second reasons can be particularly important in a semiconductor memory device. If the HVCD and HVCP1 levels vary during operation, unless the values are returned to the ½VCC level immediately, the semiconductor memory device can fail due to a degraded sense margin.

Accordingly, to avoid failures such as those described above, a conventional semiconductor memory device can maintain a precharge potential HVCD and an opposite-to-cell potential HVCP1 at a ½VCC level. However, in order to carry out certain test modes, an HVCC generating circuit can include a transfer gate within. In such an arrangement, during a test mode, the transfer gate can be turned off. The opposite-to-cell HVCP1 can then be placed to a low power supply level (such as "ground") or to a high power supply level (such as VCC).

As noted above, a conventional semiconductor memory device can have an opposite-to-cell potential HVCP1 that is connected to a precharge potential by a passgate situated within an HVCC generating circuit. In such an arrangement, if there is a potential level fluctuation in a remotely situated memory cell, the precharge potential may not be supplied as the opposite-to-cell potential at a sufficient enough rate. As a result, such a rate of supply may be so low that proper sense margins are not maintained and erroneous operation can result.

More particularly, low logic values can be written into memory cells after power is applied to the device. Coincidentally, the memory cells can be refreshed. In such an operation, the floating data nodes, for example, those data nodes that have not yet had any data written into them, can be driven to a high level (VCC for example). Such a rising potential at data nodes can result in the opposite-to-cell level HVCP1 also rising in potential. This can lead to a device failure when reading low logic levels from memory cells having such a raised HVCP1 level.

In even more detail, when power is switched on in a semiconductor memory device, the opposite-to-cell level HVCP1 can rise to a ½VCC level. Immediately thereafter, when a coincidental refresh operation occurs, the level at floating cell data nodes can be driven toward the VCC level. Such a rise in potential can result in the opposite-to-cell level HVCP1 also rising, due to capacitive coupling between the high logic values on the previously floating refreshed data nodes and the opposite-to-cell node carrying the HVCP11 level. If the HVCC level generating circuit 701 has sufficient level supplying activity to compensate for such a rise in the opposite-to-cell level HVCP1, normal operations can proceed without failure due to improper sense margins. However, conventional approaches may not be able to compensate for higher than desired opposite-to-cell levels that can lead to failures when reading logic zero values.

For example, a conventional HVCC level generating circuit 701 can be constructed with a transfer gate to accommodate different HVCP1 levels in a test mode. Due to the transfer gate, in a non-test mode, where the ½VCC level is being supplied as the HVCD and HVCP1 levels, the HVCC level generating circuit 701 may not be able to meet fluctuations in HVCP1 levels introduced by a coincidental refresh, as described above.

Further, in a conventional semiconductor memory device, memory cells may be situated remotely from the HVCC level generating circuit 701. Consequently, due to parasitic resistance and/or capacitance, the HVCC level generating circuit 701 may not be able to meet fluctuations in HVCP1 levels introduced by a coincidental refresh as previously described.

Thus, in a conventional case, a logic low level can be written into a number of cells prior to a coincidental refresh operation. A coincidental refresh operation may then drive logic high levels into those cells that have not yet had data written into them. This logic high level, due to capacitive coupling, can cause a rise in the opposite-to-cell level HVCP1. Then, if data is read from (or refreshed in) those cells storing a logic low, due to the undesirable high HVCP1 level, sense amplifiers may erroneously detect a high logic level instead of the stored low logic level. This causes a failed read operation.

It would be desirable to arrive at some way of addressing the above-described drawbacks to conventional semiconductor memory devices.

SUMMARY OF THE INVENTION

Embodiments of the present invention can remedy possible erroneous read operations that occur after a coincidental refresh operation. According to an embodiment, a semiconductor memory device can have a half source voltage supply circuit that supplies a half source voltage to memory cells and to precharge circuits. The semiconductor memory device can prevent degradation of sense margins by blocking unwanted fluctuations in memory cell nodes.

According to one embodiment of the present invention, a semiconductor memory device uses a half power source level as an opposite-to-cell potential and a digit line precharge potential. An opposite-to-cell potential can be the potential of a node situated opposite to a data storage node in a memory cell. The semiconductor memory device can further include shunting means that shunt the opposite-to-cell level and the precharge level. Such shunting means can be placed at various locations close to sense amplifier areas and thereby inhibit the development of fluctuations in signals of memory cells, even memory cells that are situated at remote ends of the device. This can prevent the degradation of sense margins that can occur in conventional approaches.

According to one aspect of the embodiments, a semiconductor memory device can use a half power supply potential as an opposite-to-cell level and as a digit line precharge level. The half power supply potential can be supplied by a half supply level generating means. Shunting means can shunt the opposite-to-cell level and the precharge level. Such shunting means can be situated at a number of places on the semiconductor memory device. In such an arrangement, it can be possible to inhibit fluctuations in memory cell levels that can occur from coupling, when a coincidental refresh operation occurs immediately after power-up. Such fluctuations can be inhibited even in memory cells that are situated remotely from the half supply level generating means.

According to another aspect of the embodiments, the shunting means can include a shunt test circuit that can interrupt the connection between the opposite-to-cell level and the precharge level. The opposite-to-cell level may further be placed at a specified test level.

According to another aspect of the embodiments, a level generating means can include a test circuit that can interrupt the connection between the opposite-to-cell level and the precharge level. The opposite-to-cell level may further be placed at a specified test level.

The test circuit arrangements described above can make it possible to place the opposite-to-cell level at a specified potential, such as ground or a power source potential during a test mode. Further, in the case where a level generating means includes a test circuit, shunting means can make it possible to inhibit fluctuations in memory cell levels that can occur from coupling when a coincidental refresh operation occurs immediately after power-up. This can improve sense margins.

According to another aspect of the embodiments, the shunting means can be situated close to areas where sense amplifiers are formed. This arrangement can inhibit fluctuations in the opposite-to-cell level close to such sense amplifier areas. Such fluctuations can be generated as a result of coupling when a refresh operation is introduced immediately after power-up. Unless inhibited, such fluctuations can lead to failed operations. In this way, proper sense margins can be ensured.

DETAILED DESCRIPTION OF THE EMBODIMENTS

The present invention will now be described in detail. The present invention can include a semiconductor memory device that supplies a half source voltage as a digit line precharge voltage and as an opposite-to-cell level voltage. The present invention can further include shunting means situated at a number of places on the semiconductor memory device, including sense amplifier areas. The shunting means can connect opposite-to-cell nodes of predetermined memory cells to a precharge potential. In this arrangement, the development of fluctuations in memory cell nodes, that can occur through coupling during a coincidental refresh operation, can be inhibited.

Various examples of a semiconductor memory device according the present invention will now be described. It should be understood, however, that the present invention should not be limited to such examples, and can be subject to variations and modifications within the scope defined by the summary of the invention and/or the appended claims.

Figure 1:
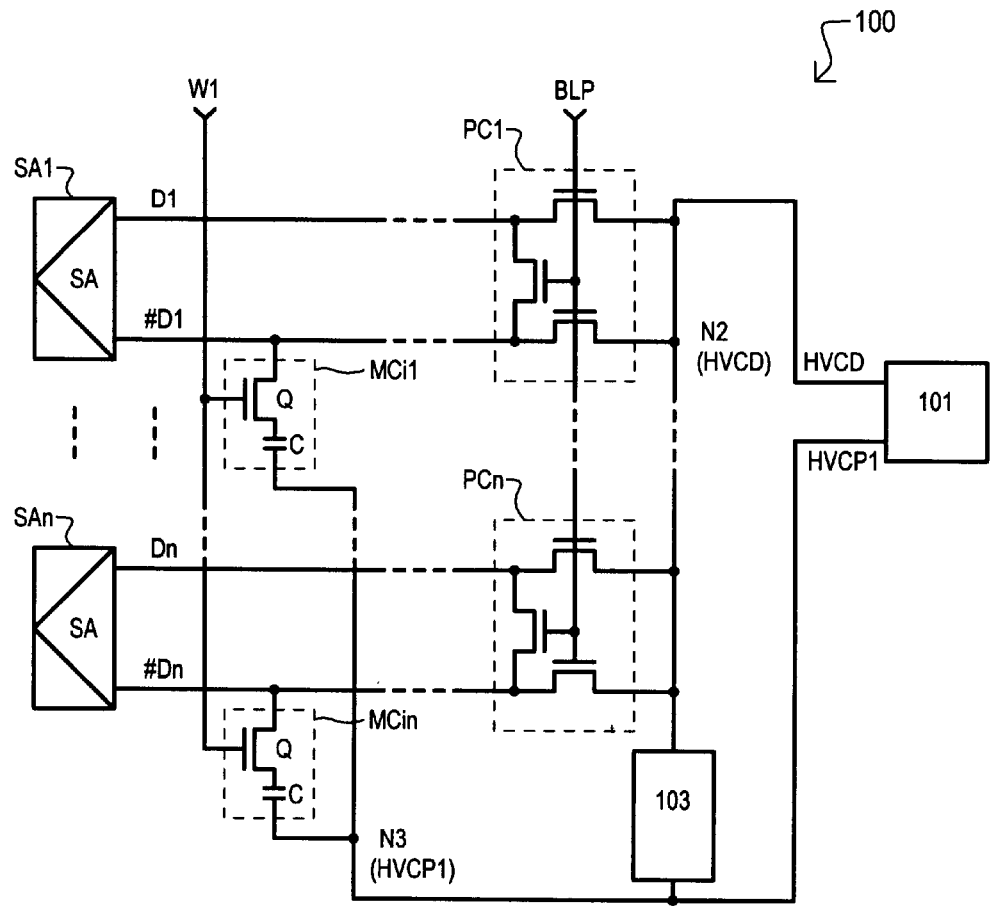
FIG. 1 is a circuit diagram of a semiconductor memory device according to one embodiment of the present invention.
Figure 7:
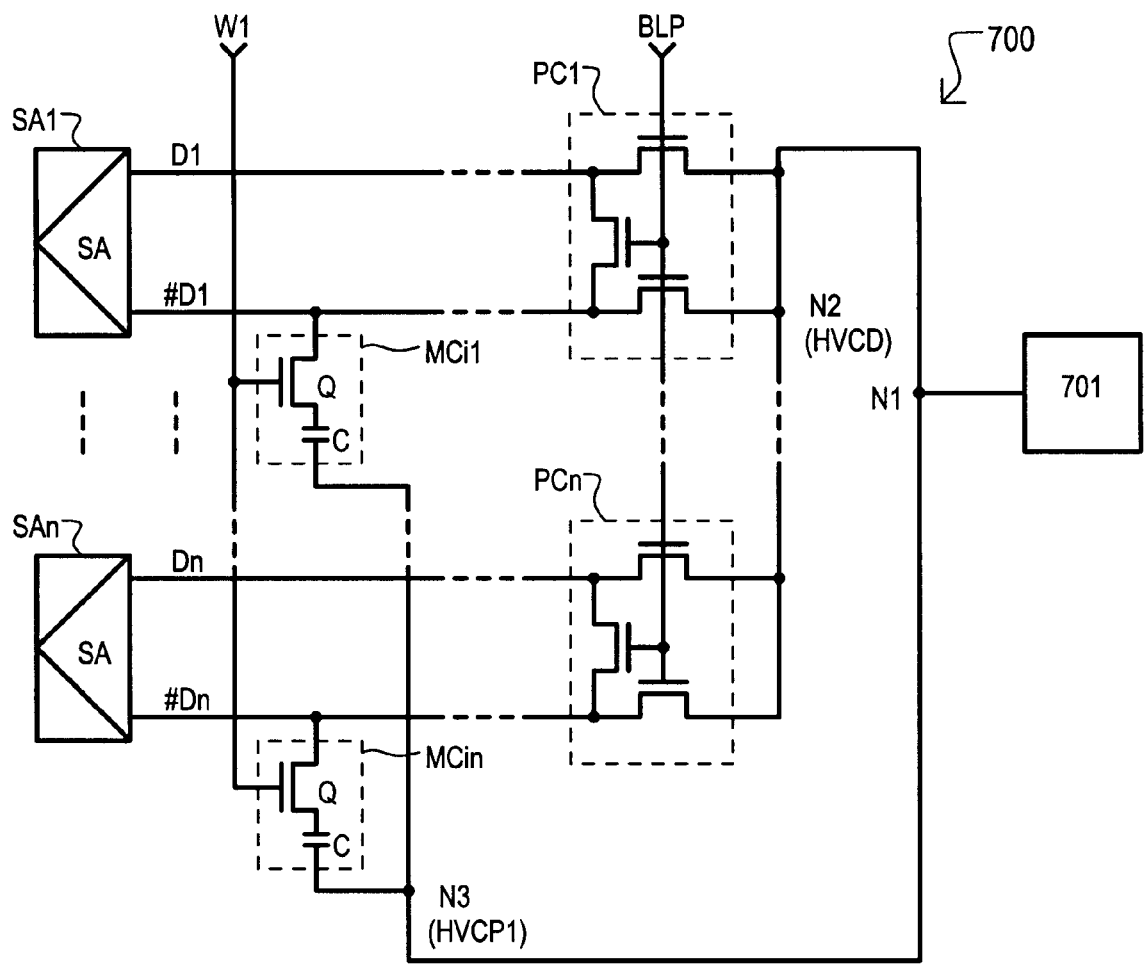
FIG. 7 is a circuit diagram of a conventional semiconductor memory device.

FIG. 1 is a circuit diagram of a semiconductor memory device according to a first example. The semiconductor memory device can include similar constituents as the conventional case set forth in FIG. 7. To that extent, like constituents will be referred to by the same reference character, but with the first digit being a "1" instead of a "7."

The semiconductor memory device of FIG. 1 is designated by the general reference character 100, and can include a half source voltage (HVCC) level generating circuit 101 that can provide a half source voltage ½VCC level, memory cells MCi1 to MCin (where i can be a positive integer) each having a transistor Q and a capacitor C, precharge circuits PC1 to PCn that can precharge digit lines D1/#D1 to Dn/#Dn according to a signal BLP, and sense amplifiers SA1 to SAn.

Unlike conventional approaches, the semiconductor memory device 100 can also include shunting circuit 103.

The HVCC level generating circuit 101 can represent a level generating means. The value VCC can represent the voltage of a power source. The symbol "#" can indicate that a line can carry negative logic signals. The shunting circuit 103 can represent a shunting means.

Memory cells (MCi1 to MCin) can form part of an m x n memory cell array, where "m" and "n" are positive integers. The semiconductor memory device 100 can further include peripheral circuit sections, including column and row drivers, column and row decoders, a buffer, an output circuit, and a refresh circuit, to name but a few. Such circuit sections are well known to those skilled in the art. Consequently, because such circuits can be considered ancillary to the present invention, a description of these circuit sections is omitted.

As shown in FIG. 1, the semiconductor memory device 100 of the first example includes a node N3 that is connected to the capacitors of memory cells (MCi1 to MCin). Node N3 can be considered to receive an "opposite-to-cell" level HVCP1, as it is connected to the capacitor node opposite to a data storage node. The semiconductor memory device 100 also includes a node N2 that receives a precharge level HVCD. The precharge level HVCD can be construed as a reference level during a sense operation. The HVCC level generating circuit 101 can supply a ½VCC potential as the HVCP1 and HVCD levels.

Figure 2:
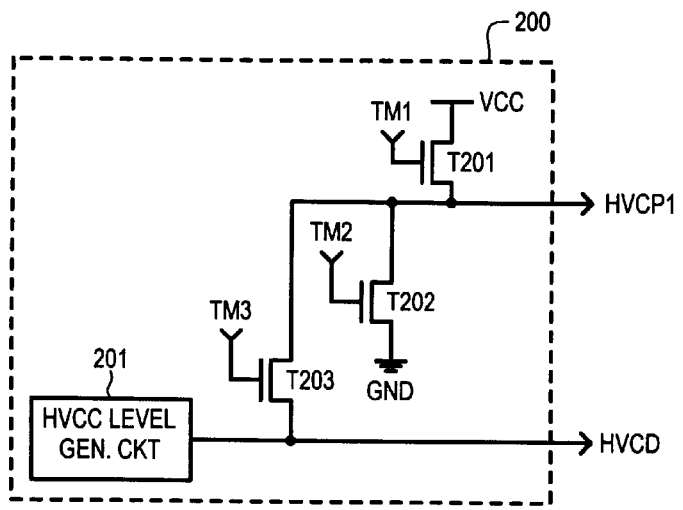
FIG. 2 is a circuit diagram of a half source voltage (HVCC) level generating circuit according the one embodiment.

Referring now to FIG. 2, a circuit diagram is set forth illustrating an HVCC level generating circuit according to one embodiment. The HVCC level generating circuit can be employed as item 101 of the semiconductor memory device of FIG. 1. The HVCC level generating circuit is designated by the general reference character 200, and is shown to include an HVCC level generating portion 201 and a supply testing circuit that includes transistors T201, T202 and T203. Transistors T201 to T203 can be switched on and off according to test mode signals TM1 to TM3. The HVCC level generating circuit 200 can supply an opposite-to-cell level HVCP1 and a precharge level HVCD.

In an ordinary mode of operation, transistors T203 can be construed as a transfer gate, and can remain switched on, and thereby shunt the opposite-to-cell (HVCP1) level and precharge (HVCD) level. As noted above, a precharge level HVCD can be considered a reference level in a sense operation. In the ordinary mode of operation, transistors T201 and T202 can be turned off by test signals TM1 and TM2. One skilled in the art would recognize the transistors T201 to T203 can provide controllable impedance paths.

In a test mode of operation, transistor T203 can be turned off by test mode signal TM3. In addition, transistor T201 can be turned on, thereby changing the opposite-to-cell level HVCP1 to a power source potential VCC and transistor T202 can be turned off. Alternatively, transistor T202 can be turned on, thereby changing the opposite-to-cell level HVCP1 to a ground potential GND and transistor T201 can be turned off.

Figure 3:
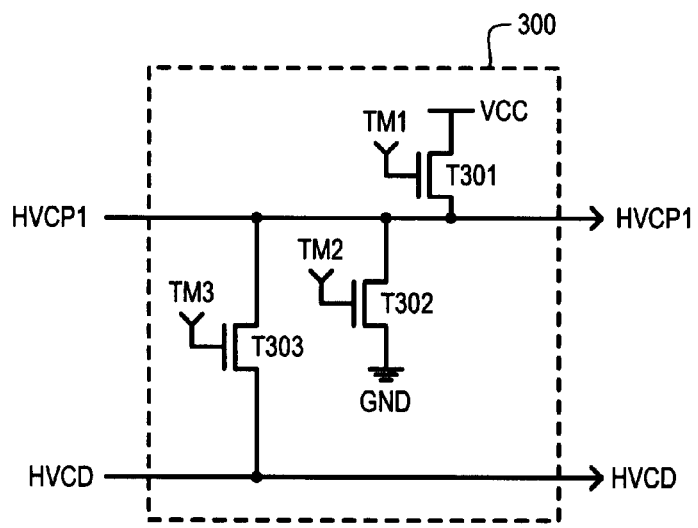
FIG. 3 is a circuit diagram of a shunting circuit according to one embodiment.

Referring now to FIG. 3, a circuit diagram is set forth illustrating a shunting circuit according to one embodiment. The shunting circuit can be employed as item 103 of the semiconductor memory device of FIG. 3. The shunting circuit is designated by the general reference character 300, and includes a shunt testing circuit that comprises transistors T301, T302 and T303. Transistors T301 to T303 can be switched on and off according to test mode signals TM1 to TM3. The shunting circuit 300 can receive an opposite-to-cell level HVCP1 and a precharge level HVCD.

In an ordinary mode of operation, transistor T303 can be construed as a transfer gate, and can remain switched on, and thereby shunt the opposite-to-cell (HVCP1) level and a precharge (HVCD) level. As noted above, a precharge level HVCD can be considered a reference level in a sense operation. In the ordinary mode of operation, transistors T301 and T302 can be turned off by test signals TM1 and TM2. One skilled in the art would recognize that transistors T301 to T303 provide controllable impedance paths.

In a test mode of operation, transistor T303 can be turned off by test mode signal TM3. In addition, transistor T301 can be turned on, thereby changing the opposite-to-cell level HVCP1 to a power source potential VCC and transistor T302 can be turned off. Alternatively, transistor T302 can be turned on, thereby changing the opposite-to-cell level HVCP1 to a ground potential GND and transistor T301 can be turned off.

Referring once again to FIG. 7, in a conventional semiconductor memory device, the HVCC level generating circuit 701 can distribute a precharge level (reference level) HVCD and opposite-to-cell level HVCP1 to the semiconductor memory device. In particular arrangements, the HVCP1 (reference) level can be provided to a memory cell "plate" that is common to a number of memory cells. Generally, in the conventional case, it is not necessary to allow the two signals (HVCP1 and HVCD) to be independent. If the HVCP1 and HVCD levels are always maintained at the ½VCC level, no difference will exist between the opposite-to-cell level HVCP1 and the precharge (reference) level HVCD, and hence sense margins will be same whether a memory cell is at a high level or a low level.

However, in order to accommodate various test modes, a conventional HVCC level generating circuit can include a structure such as that set forth in FIG. 2 that allows the opposite-to-cell level HVCP1 to be changed to a supply source potential VCC or a ground potential GND. As shown in FIG. 2, an HVCP1 level can be connected to a precharge (reference) level HVCD by a transfer gate T203. Thus, the two levels (HVCP1 and HVCD), while typically being maintained at the same level (½VCC), are carried on two different lines. Because of this arrangement, in some cases, differences can arise between the aopposite-to-cell level HVCP1 and the precharge level HVCD. This can result in variations in sense margin according to whether a memory cell stores a high or low logic level, leading to degradations in sensing operations performed by sense amplifiers.

With a semiconductor memory device according one embodiment, a shunting circuit (such as 103) can serve as a countermeasure against such variations in an opposite-to-cell level HVCP1 (such as a plate potential) and a precharge level HVCD (which can serve as a sense amplifier reference voltage).

Figure 4:
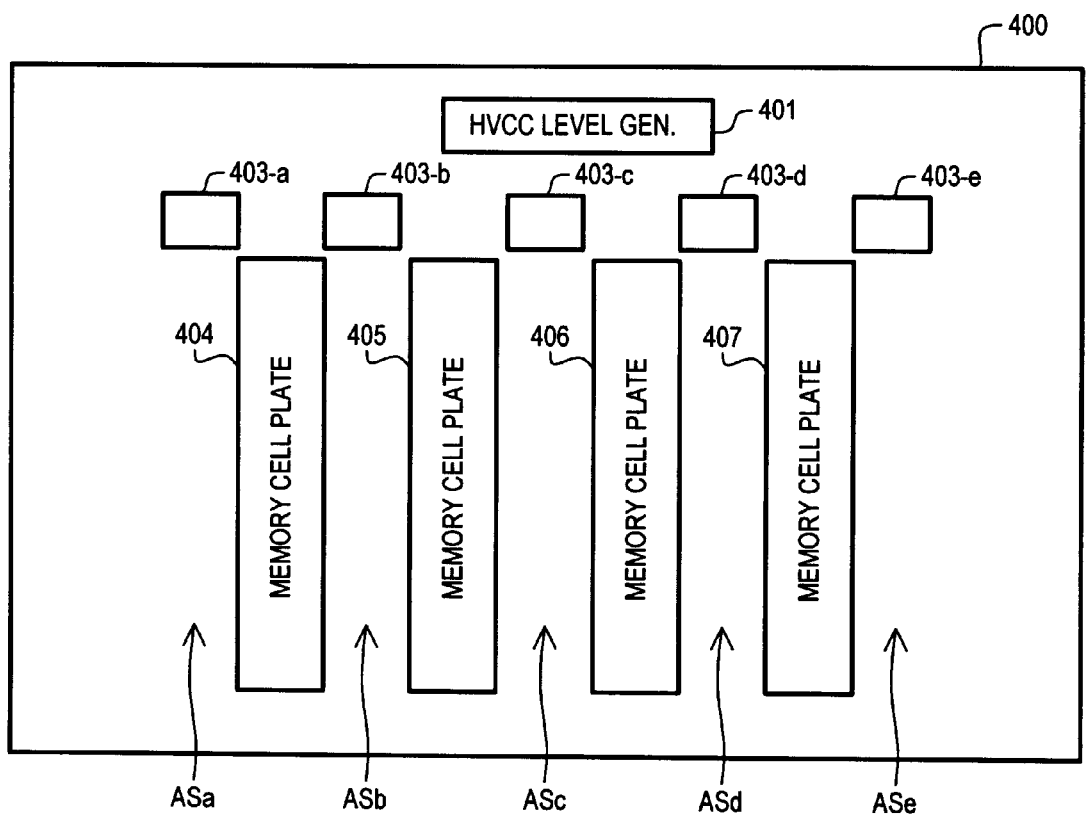
FIG. 4 is a top plan view of a chip layout according to one embodiment.

One skilled the art would recognize that a shunting circuit can serve to equalize the opposite-to-cell level HVCP1 and the precharge level HVCD at a location that is more proximate to locations where variations in the HVCP1 and/or HVCD levels could arise. In one particular arrangement, shunting circuits can be situated close to sense amplifier areas associated with particular cell plates. Such an arrangement is shown in a chip layout in FIG. 4. In particular, FIG. 4 shows a chip 400 that can include an HVCC level generating circuit area 401, shunting circuit areas 403-a to 403-e, memory cell plates 404 to 407, and sense amplifier areas ASa to ASe. As shown in FIG. 4, the shunting circuit areas 403-a to 403-e are placed close to the sense amplifier areas ASa to ASe, respectively.

One skilled in the art would recognize that a memory cell "plate" can have a number of embodiments. A memory cell plate could represent a common electrical connection between the capacitor nodes of a number of memory cells. Further, a memory cell plate could be a conductive structure formed over a number of memory cells, providing a common capacitor node. As such, a memory cell plate can be maintained at the opposite-to-cell level.

In a semiconductor memory device according to the example of FIG. 4, shunting circuits located in shunting circuit areas 403-a to 403-e can shunt the opposite-to-cell level HVCP1 and the precharge (reference) level HVCD. As shown in FIG. 4, shunting circuit areas 403-a to 403-e can be placed at various locations close to sense amplifier areas ASa to ASe. Thus, if the semiconductor memory device 400 includes an HVCC level generating circuit with a transfer gate to connect HVCP1 and HVCD levels (to accommodate test modes), and a coincidental refresh operation after power-up results in fluctuations in the opposite-to-cell level due to capacitive coupling, the adverse effect of such fluctuations can be resolved the shunting circuits. The shunting circuits can maintain the HVCP1 and HVCD levels at essentially equal values. In this way, sense amplifiers can be provided with an HVCP1 level that does not fluctuate with respect to a corresponding HVCD level.

In other words, the above-described embodiments can inhibit an undesirable rise in the HVCP1 level that might otherwise occur as a result of a coincidental refresh immediately after power-up. The HVCP1 can be maintained at about the ½VCC level, and can thereby essentially ensure the same sense margin regardless of whether a read (or refreshed) memory cell stores a logic one or a logic zero. In this way, sense margins can be improved over conventional approaches.

Figure 5:
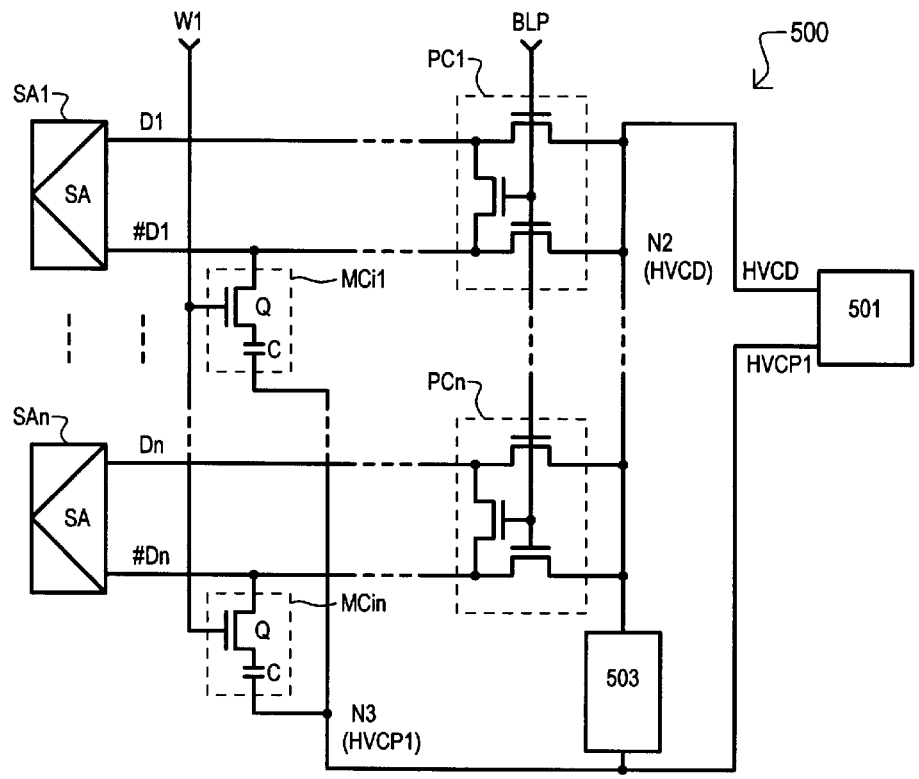
FIG. 5 is a circuit diagram of a semiconductor device according to another embodiment of the present invention.

Referring now to FIG. 5, a circuit diagram is set forth showing a second example of a semiconductor memory device according to the present invention. The semiconductor memory device of FIG. 5 can include similar constituents to the example forth in FIG. 1. To that extent, like constituents will be referred to by the same reference character, but with the first digit being a "5" instead of a "1." Further, a repetitive discussion of such constituents will be omitted.

The semiconductor memory device of FIG. 5 can differ from that of FIG. 1 in that the HVCC level generating circuit 501 does not include a test circuit, such as that formed by transistors T201 to T203 in FIG. 2.

The remaining components of the circuit of FIG. 5 can be the same as those in FIG. 1.

In FIG. 5, the HVCC level generating circuit 501 essentially serves only to provide a ½VCC level for an opposite-to-cell level HVCP1 and a precharge (reference) level HVCD, and does not include a test circuit. Instead, testing capabilities can be provided by shunt circuit 503 that can include test circuits such as those shown in FIG. 3. Such an arrangement can eliminate duplicate connections and/or components that can be present where an HVCC level generating circuit includes a test circuit.

Further, in a semiconductor memory device according to the example set forth in FIG. 5, a shunting circuit (such as 503) can be situated close to sense amplifier areas of corresponding memory cell plates. One such arrangement is shown in FIG. 6.

Figure 6:
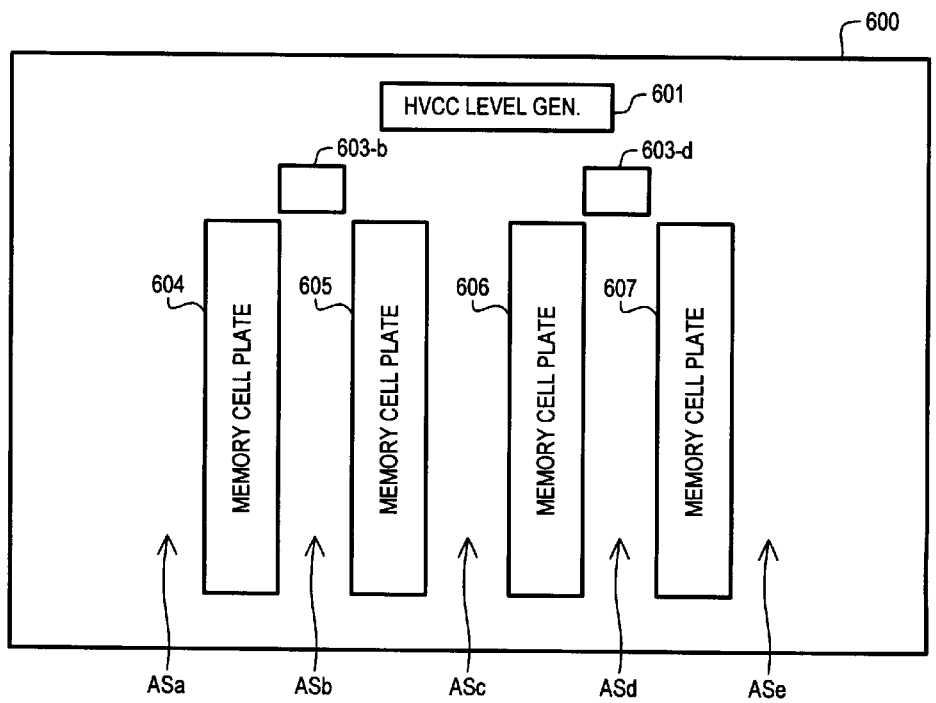
FIG. 6 is a top plan view of a chip layout according to one embodiment.

In particular, FIG. 6 shows a chip 600 that can include an HVCC level generating circuit area 601, shunting circuit areas 603-b and 603-d, memory cell plates 604 to 607, and sense amplifier areas ASa to ASe. As shown in FIG. 6, the shunting circuit areas 603-a to 603-e can be placed close to the sense amplifier areas ASb and ASd.

FIG. 6 also illustrates how it can be possible to distribute a shunting circuit (such as 503) for every two adjacent memory cell plates (604 to 607) without loss of functionality, instead of placing a shunting circuit next to each memory cell plate (as set forth in FIG. 4). Thus, the approach of FIG. 6 can provide greater design freedom in the distribution of shunting circuits. Indeed, it can be possible to achieve the functionality of a semiconductor memory device having the layout of FIG. 4 with a semiconductor memory device having the layout of FIG. 6.

As described above, a semiconductor memory device can include shunting circuits (such as 503) that shunt the opposite-to-cell level HVCP1 and the precharge (reference) level HVCD. Shunting circuits can be placed according to the layout of FIG. 6, resulting in shunting circuits that are close to sense amplifier areas ASb and ASd. Therefore, it can be possible to inhibit fluctuations that can result from coupling when a coincidental refresh operation occurs after power up. Such an inhibiting of fluctuations can occur even for memory cells situated remotely from an HVCC level generating circuit. In this way, sense margins can be improved.

The present invention can include a semiconductor memory device that uses a half power supply potential for an opposite-to-cell level and for precharging digit lines. The semiconductor memory can be further characterized by shunting means that can shunt the opposite-to-cell level and precharge level. Through this feature, it can be possible to ensure the notable advantage of inhibiting undesirable fluctuations in various signals that can occur from a coincidental refresh operation that occurs after power-up. Such an advantageous inhibiting of fluctuations can even occur in memory cells that are situated remotely from a half power supply generating means.

Further, a semiconductor memory device according to the present invention may also include shunting means, each of which can include a test circuit. A test circuit can interrupt the connection between the opposite-to-cell level and the precharge level in a test mode. In such an arrangement, it can be possible to ensure the notable advantage of placing the opposite-to-cell level to a specified potential, such as a ground or power supply potential. Further, even if a half power supply generating means includes a testing circuit, such shunting means can inhibit fluctuations which can result from a coincidental refresh operation that occurs after power-up. This can improve sense margins.

Still further, a semiconductor memory device according to the present invention can include shunting means situated close to sense amplifier areas. In such an arrangement, it can be possible to inhibit fluctuations in an opposite-to-cell level close to a sense amplifier that can be generated as a result of a coincidental refresh operation introduced immediately after power-up, and lead to failed operations. In this way, proper sense margins can be ensured.

One skilled in the art would recognize that while the above embodiments describe a half "supply" or half "source" level, it is understood that the source or supply is not necessarily the potential supplied to a power supply pin of the semiconductor memory device. As just one example, a supply (or source) can be a "stepped-down" internal voltage, that is lower than an externally applied high supply voltage, or alternatively, a "stepped-up" internal voltage, that is higher than an externally applied high supply voltage.

It obviously follows that while the above embodiments describe a "ground" level, it is understood that a ground is not necessarily a ground potential supplied to an external supply pin of the semiconductor memory device. As just one example, a ground can be a virtual or relative ground, that is higher than, or lower than an external ground level.

Still further, one skilled in the art would recognize that while the various embodiments describe opposite-to-cell and precharge levels of ½VCC, such an arrangement should not be construed as necessarily limiting the invention thereto. Alternate embodiments could have opposite-to-cell and precharge levels between a high internal supply level and a low internal supply level, but not necessarily at ½VCC.

Finally, it is understood that while the various embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. In a semiconductor memory device that includes a plurality of memory cells, each including a transistor and a capacitor, the capacitors having a first node coupled to the corresponding transistor and a second node that can be placed at an opposite-to-cell level, the semiconductor memory device using an approximately half power source level for the opposite-to-cell level and a digit line precharge level, the semiconductor memory device comprising:

a level generating means to provide the approximately half power source level as the opposite-to-cell level and the precharge level; and a plurality of shunting means to shunt the opposite-to-cell level and the precharge level, each shunting means comprises a shunt testing circuit to interrupt a connection that shunts the opposite-to-cell level and the precharze level during a test mode.

2. The semiconductor memory device of claim 1, wherein:

the shunt testing circuit further places the opposite-to-cell level to a predetermined potential that is different than the approximately half power source level during the test mode.

3. The semiconductor memory device of claim 1, wherein:

the level generating means comprises a generating means testing circuit to interrupt a connection that shunts the opposite-to-cell level and the precharge level during a test mode.

4. The semiconductor memory device of claim 3, wherein:

the level generating means further places the opposite-to-cell level to a predetermined potential during the test mode that is different than the approximately half power source level.

5. The semiconductor memory device of claim 1, further including:

sense amplifier areas in which sense amplifiers are formed; and the shunting means are formed in proximate to the sense amplifier areas.

6. A semiconductor memory device, comprising:

a plurality of memory cells arranged into a number of arrays, each memory cell including a transistor and a capacitor, each capacitor having a first node connected to the transistor of the memory cell and a second node, the second nodes of the capacitors of the same array being commonly coupled to a plate node;

a plurality of precharge circuits arranged into groups, each precharge circuit group being coupled to at least one array and to a precharge level node; and a plurality of shunting circuits, each shunting circuit providing a low impedance path between the plate node and the precharge node in a non-test mode, and a high impedance path between the plate node and the precharge node in a test mode.

7. The semiconductor memory device of claim 6, further including:

each precharge circuit is coupled to at least one digit line; and a sense amplifier coupled to each digit line.

8. The semiconductor memory device of claim 6, wherein:

each shunting circuit includes at least one transfer gate transistor having a source-drain path coupled between the plate node and the precharge node.

9. The semiconductor memory device of claim 6, wherein:

each shunting circuit further includes at least one transistor having a source-drain path coupled between the plate node and a predetermined test voltage node.

10. The semiconductor memory device of claim 6, further including:

a level generating circuit that provides a predetermined potential to at least the precharge node.

11. The semiconductor memory device of claim 10, further including:

the semiconductor memory device receives a high supply potential and a low supply potential; and the predetermined potential is between the high supply potential and the low supply potential.

12. The semiconductor memory device of claim 11, wherein:

the predetermined potential is approximately half the high supply potential.

13. A semiconductor device, comprising:

a plurality of memory cells coupled to at least one opposite-to-cell node;

a plurality of sense amplifiers arranged into groups, the sense amplifiers being coupled to at least one reference node, the number of sense amplifiers in each group being a number n; and a plurality of shunting circuits that couple the at least one opposite-to-cell node to the at least one reference node in a first mode, the number of shunting circuits being less than the number n.

14. The semiconductor device of claim 13, wherein:

the memory cells each include a transistor and a capacitor, one terminal of each capacitor being coupled to a transistor and another terminal of each capacitor being coupled to a cell plate, each cell plate being coupled to the at least one opposite-to-cell node.

15. The semiconductor device of claim 13, wherein:

the memory cells are arranged into a number of arrays;

each sense amplifier group is formed adjacent to at least one array; and each shunting circuit is formed adjacent to at least one sense amplifier group.

16. The semiconductor device of claim 13, wherein:

each shunting circuit isolates the at least one opposite-to-cell node from the at least one reference node in a second mode.

17. The semiconductor device of claim 16, wherein:

each shunting circuit couples the at least one opposite-to-cell node to a test potential node in the second mode.

* * * * *